United States Patent
Sun et al.

(10) Patent No.: US 11,832,380 B2
(45) Date of Patent: Nov. 28, 2023

(54) FAN STRUCTURE AUTOMATICALLY MOUNTABLE ON A SYSTEM CIRCUIT BOARD

(71) Applicant: ASIA VITAL COMPONENTS CO., LTD., New Taipei (TW)

(72) Inventors: Sung-Wei Sun, New Taipei (TW); Ming-Che Lee, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 4 days.

(21) Appl. No.: 17/465,787

(22) Filed: Sep. 2, 2021

(65) Prior Publication Data
US 2023/0067604 A1 Mar. 2, 2023

(51) Int. Cl.
H05K 7/20 (2006.01)
H05K 1/02 (2006.01)
H05K 1/11 (2006.01)

(52) U.S. Cl.
CPC .......... *H05K 1/0209* (2013.01); *H05K 1/117* (2013.01); *H05K 7/20172* (2013.01); *H05K 2201/10189* (2013.01)

(58) Field of Classification Search
CPC ................................................ H05K 7/20172
See application file for complete search history.

(56) References Cited

U.S. PATENT DOCUMENTS 6,808,411 B2 * 10/2004 Chen .................. H05K 7/20172
 439/246
2012/0114512 A1 5/2012 Lofy et al.

FOREIGN PATENT DOCUMENTS

| CN | 208089591 U | 11/2018 | |
| CN | 111749909 A | 10/2020 | |
| JP | 2005299412 A * | 10/2005 | ............. F04D 25/08 |
| TW | M309777 | 4/2007 | |
| TW | M383141 | 6/2010 | |
| TW | 201041494 A1 | 11/2010 | |
| TW | M578478 | 5/2019 | |
| TW | M620263 | 11/2021 | |

OTHER PUBLICATIONS

Search Report dated Apr. 6, 2022 issued by Taiwan Intellectual Property Office for counterpart application No. 110131105.
Search Report dated Nov. 25, 2022 issued by Taiwan Intellectual Property Office for counterpart application No. 110131105.

* cited by examiner

*Primary Examiner* — Mukundbhai G Patel
(74) *Attorney, Agent, or Firm* — Demian K. Jackson; Jackson IPG PLLC

(57) ABSTRACT

A fan structure automatically mountable on a system circuit board includes a fan. The fan includes a fan frame main body. A connector connection section is disposed on the fan frame main body for connecting with a fan end connector, whereby the fan end connector can be assembled with the fan frame main body. Accordingly, when the fan is mounted on the system circuit board, the fan end connector can be directly pressed down by means of an automated device to plug into the circuit board end connector. Therefore, the manufacturing process can be automated.

6 Claims, 5 Drawing Sheets

FAN STRUCTURE AUTOMATICALLY MOUNTABLE ON A SYSTEM CIRCUIT BOARD

BACKGROUND OF THE INVENTION

1. Field of the Invention

The present invention relates generally to a fan field, and more particularly to a fan structure automatically mountable on a system circuit board.

2. Description of the Related Art

A fan is an often used system heat dissipation device, which is often applied to an electronic apparatus for forcedly dissipating the heat. In general, the fan must be electrically connected with the motherboard in the electronic apparatus to provide signal transmission and feedback control function and supply power to the fan.

As shown in FIG. 1, the conventional fan 30 includes a fan frame 31 and an electro-conductive wire 32 extending from the interior of the fan frame 31 to outer side thereof. One end of the electro-conductive wire 32 is electrically connected with a circuit board disposed in the fan frame. The other end of the electro-conductive wire 32 extends to the outer side of the fan frame 31 to connect with a male connector 33. The male connector 33 is plugged into a female connector 411 of the motherboard 41 of the electronic apparatus to electrically connect therewith.

The male connector 33 of the fan 30 is connected with a rear end of the electro-conductive wire 32 and suspended away from the fan frame 31. After the fan 30 is mounted and locked on the motherboard 41 of the electronic apparatus, the male connector 33 must be manually plugged into the corresponding female connector 411 of the motherboard so as to complete the assembling process. However, after the fan 30 is mounted on the motherboard 41, the electro-conductive wire 32 will have a residual part, (that is, excessively long electro-conductive wire 32) remaining between the fan 30 and the motherboard 41. Therefore, it is necessary to further trim the electro-conductive wire 32. In addition, the residual part of the electro-conductive wire 32 will interfere with the airflow in the system space and dust is apt to fall onto the residual part of the electro-conductive wire 32 to attach thereon and cause trouble.

According to the above, the conventional fan has the shortcoming that the electrical connector of the fan can be only manually assembled and mounted on the motherboard of the electronic apparatus. Such process is time-consuming and laborious. As a result, the manufacturing cost is increased and the mounting quality cannot be unified. It is therefore tried by the applicant to provide a fan structure, which can be automatically mountable on a system circuit board to solve the above problems existing in the conventional fan.

SUMMARY OF THE INVENTION

It is therefore a primary object of the present invention to provide a fan structure, which can be automatically mountable on a system circuit board.

It is a further object of the present invention to provide the above fan structure, which will not produce residual electrical wire between the fan and the system circuit board.

To achieve the above and other objects, the present invention provides a fan structure automatically mountable on a system circuit board. The system circuit board has a circuit board end connector. The fan structure includes a fan having a fan frame main body and a wire set. The fan frame main body has a connector connection section outward protruding from the fan frame main body. A fan impeller and a fan circuit board are received in the fan frame main body. The wire set has an inner end connected with the fan circuit board and an outer end exposed to outer side of the fan frame main body and connected with a fan end connector. The fan end connector is connected with the connector connection section and secured to the fan frame main body.

In the above fan structure automatically mountable on a system circuit board, the fan frame main body has an upper cover and a base seat mated with the upper cover. A sidewall is positioned between the upper cover and the base seat. The connector connection section protrudes from one of the sidewall and the base seat and is formed on the fan frame main body.

In the above fan structure automatically mountable on a system circuit, the fan end connector protrudes in a parallel direction of the sidewall or protrudes in a normal direction of the sidewall or protrudes in a normal direction of the base seat.

In the above fan structure automatically mountable on a system circuit board, the fan end connector has a mating section in adaptation to the connector connection section.

In the above fan structure automatically mountable on a system circuit board, the connector connection section is integrally formed with the fan frame main body.

In the above fan structure automatically mountable on a system circuit board, one of the fan end connector and the circuit board end connector is a connector plug, while the other of the fan end connector and the circuit board end connector is a connector socket.

In the above fan structure automatically mountable on a system circuit board, the connector connection section has an upper force-bearing face serving as a force application pressurized position for bearing an external pressure, whereby the fan end connector can be directly pressed down to electrically connect with the circuit board end connector.

In the above fan structure automatically mountable on a system circuit board, wherein a wire receiving channel is disposed on the fan frame main body for receiving the wire set.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

In the description of the present invention, unless there are other specific regulations and definitions, the following terms "disposed", "mounted", "connection", "connected", "fixed", etc. should be generally interpreted. For example, the term "connected" can mean fixedly connected, detachably connected, mechanically connected, directly connected or indirectly connected via a medium. The substantial definitions of the above terms in the description of the present invention can be understood by those who are skilled in this field according to practical situation.

Moreover, the following terms "first" and "second" are only for illustration purposes and should not be interpreted as indication or implication of the relative importance or the number of the technical features. Accordingly, the features can be defined by the terms "first" and "second" to specifically indicate or imply that there are one or more features. In the description of the present invention, the terms "a plurality of" and "multiple" mean two or more than two unless there is other specific and substantial definition.

Figure 1:
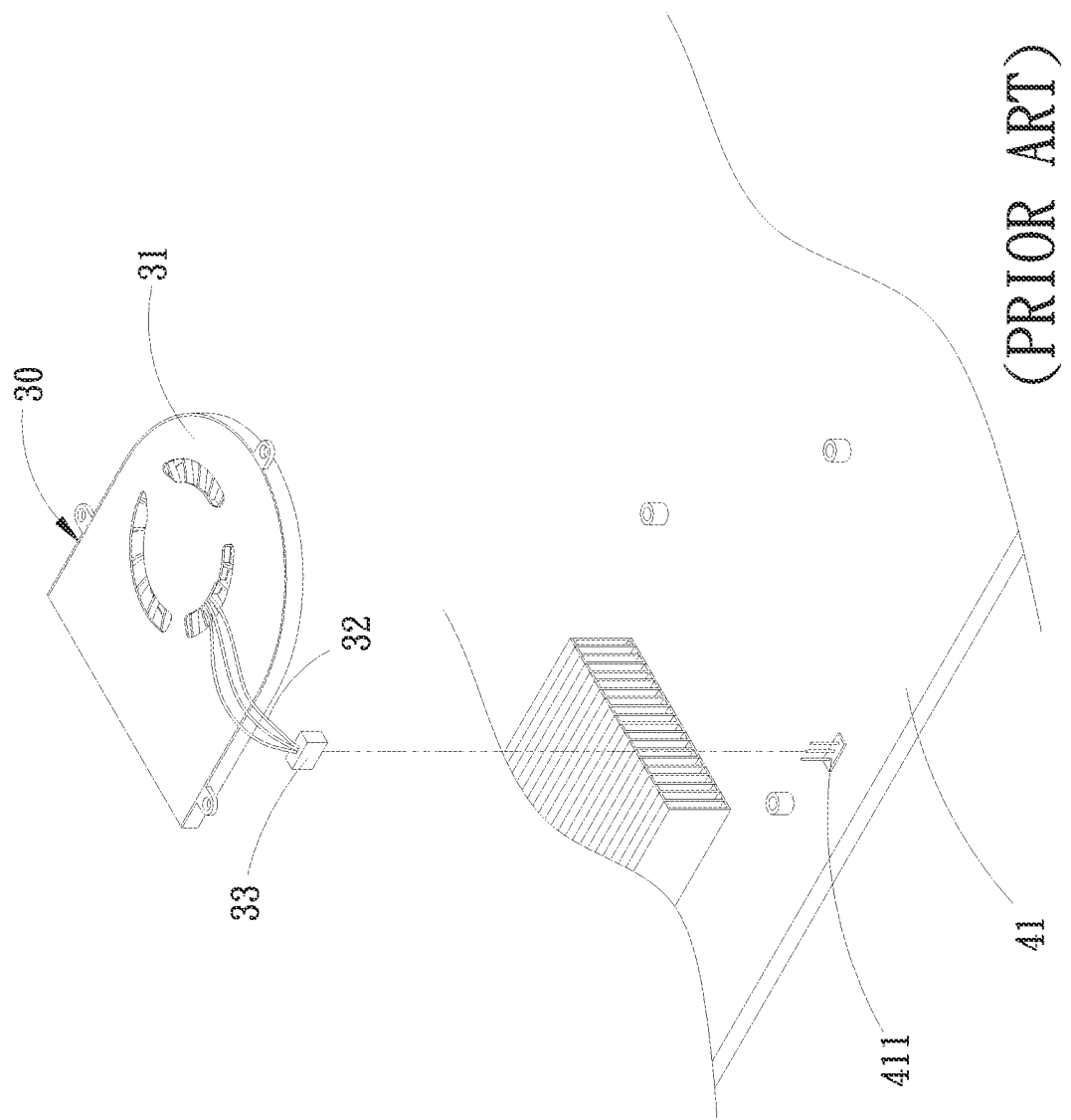
FIG. 1 is a perspective view of prior art.
Figure 2A:
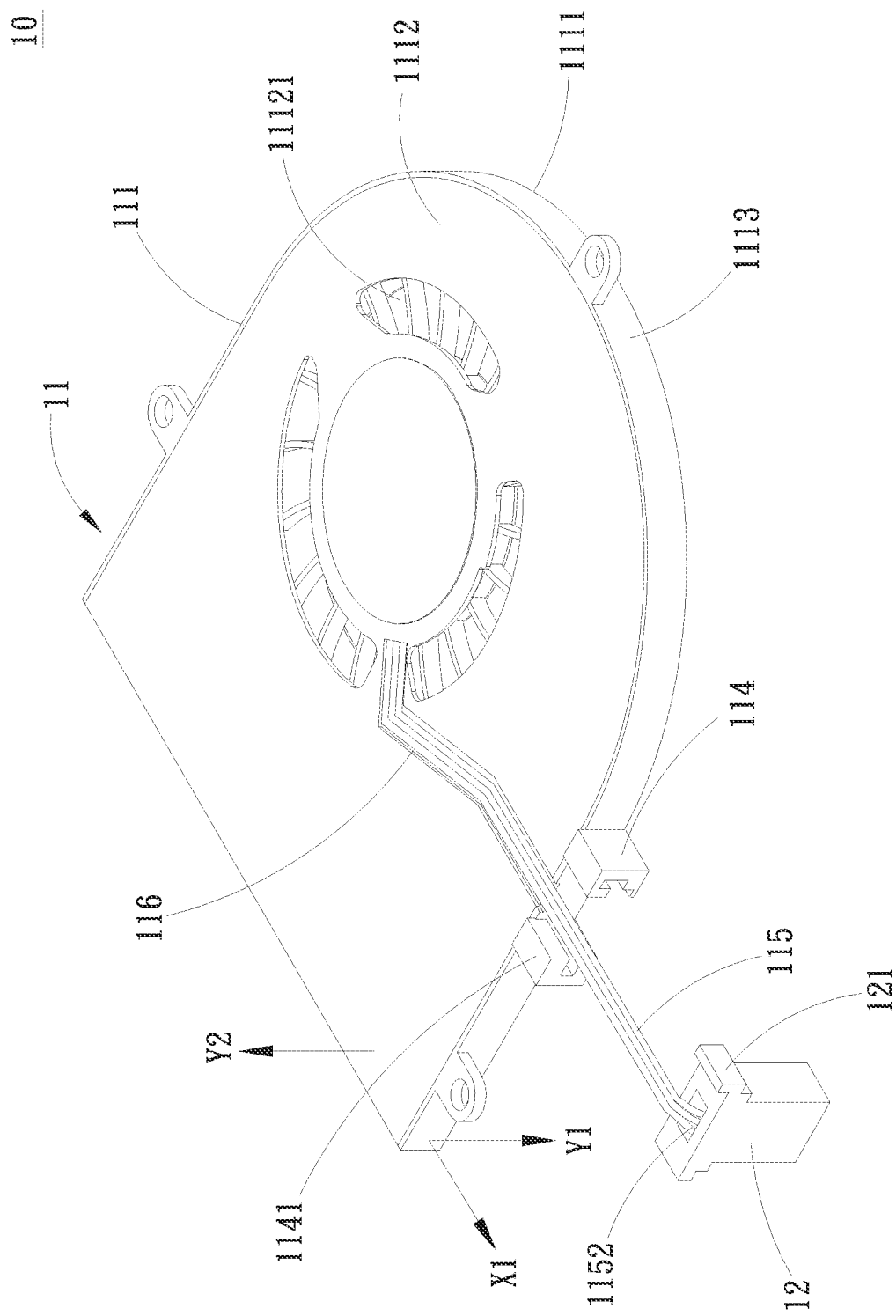
FIGS. 2A, 2B and 2C are perspective views showing the fan structure of the present invention.
Figure 2B:
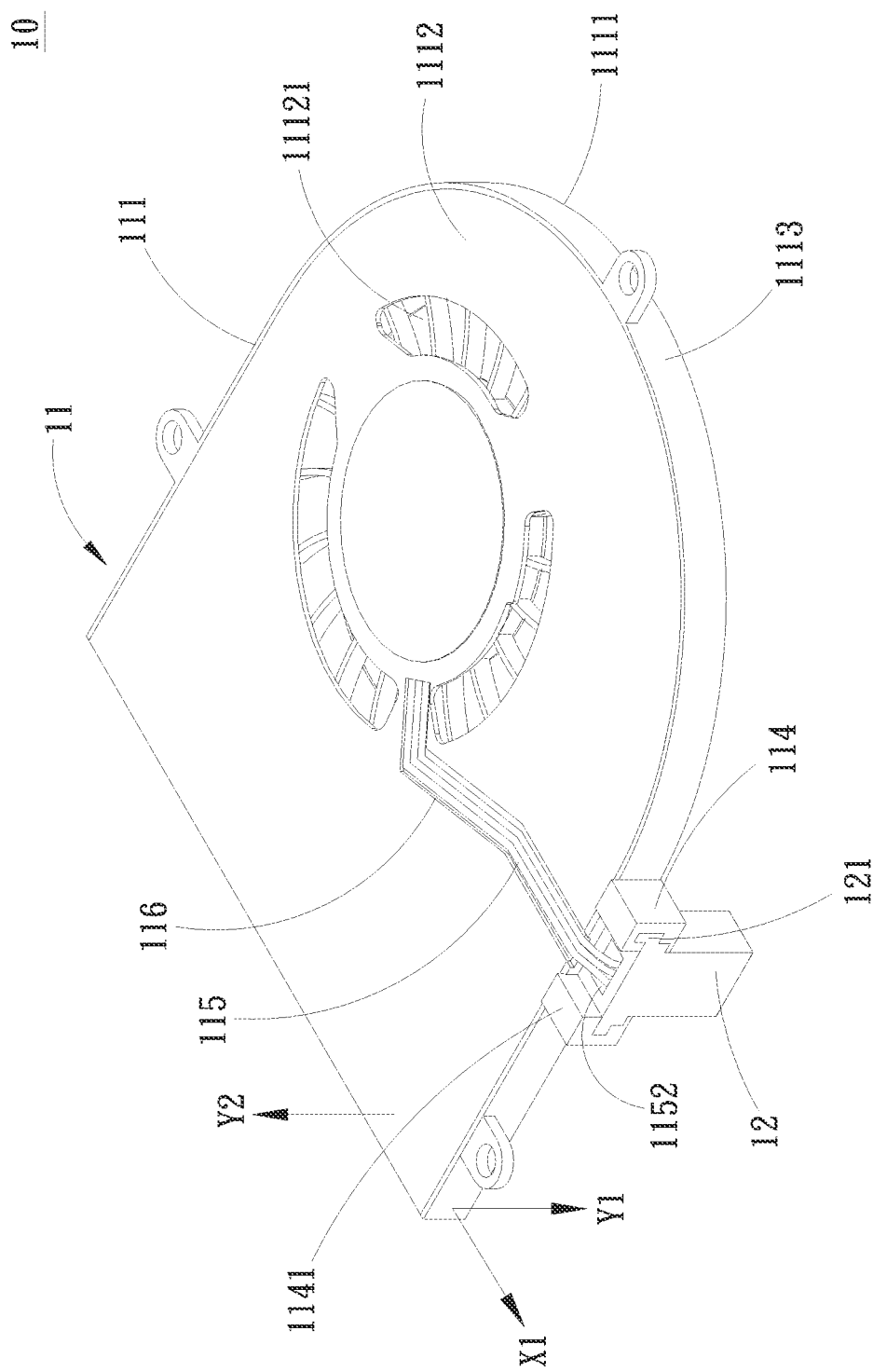
Figure 2C:
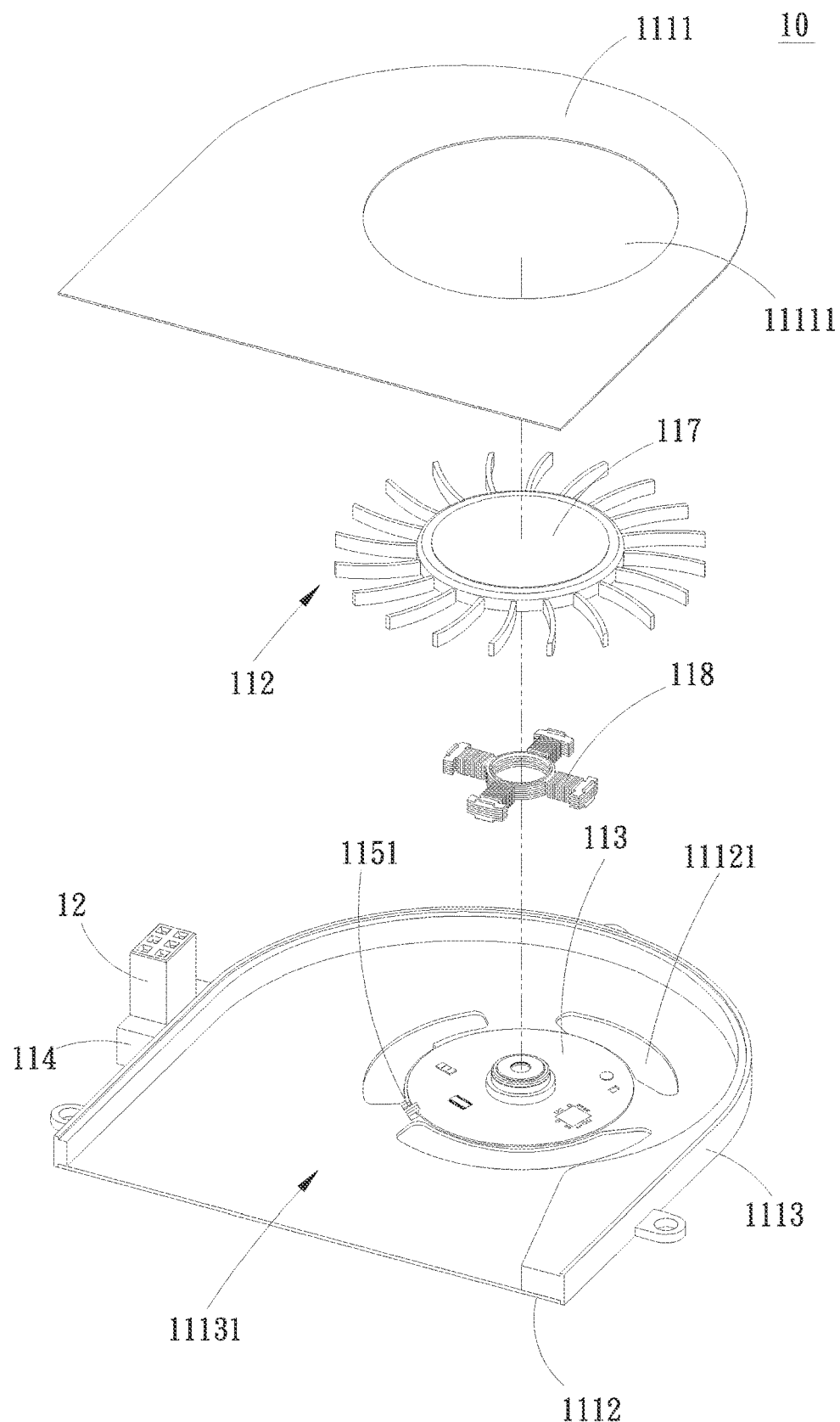

Please refer to FIGS. 2A, 2B and 2C. FIG. 2A is a perspective view of the fan structure of the present invention, showing that the fan end connector is not yet engaged with the connector connection section. FIG. 2B is a perspective view of the fan structure of the present invention, showing that the fan end connector is engaged with the connector connection section. FIG. 2C is a perspective exploded view of the fan structure of the present invention. As shown in the drawings, the fan fast connection structure 10 of the present invention includes a fan 11 and a fan end connector 12. The fan 11 includes a fan frame main body 111 and a wire set 115. In this embodiment, the fan 11 is, but not limited to, a centrifugal fan. In practice, the fan 11 can be alternatively an axial flow fan. The fan frame main body 111 has an upper cover 1111 and a base seat 1112 mated with the upper cover 1111. The fan frame main body 111 further has a connector connection section 114 outward protruding from the fan frame main body 111. A sidewall 1113 is disposed between the upper cover 1111 and the base seat 1112 and positioned along an outer periphery of the fan frame main body 111. The sidewall 1113 is integrally formed on the base seat 1112 to protrude toward the upper cover 1111. Alternatively, the sidewall 1113 is integrally formed on the upper cover 1111 to protrude toward the base seat 1112. Still alternatively, the sidewall 1113 can be an independent component connected with the upper cover 1111 and the base seat 1112.

Each of the upper cover 1111 and the base seat 1112 is formed with a wind inlet 11111, 11121. The sidewall 1113 is formed with a wind outlet 11131. A fan impeller 112, a fan circuit board 113, a rotor 117 and a stator 118 are received in the fan frame main body 111. The fan impeller 112 is positioned corresponding to the wind inlets 11111, 11121. The fan circuit board 113 is positioned under the fan impeller 112. The rotor 117 (including an annular magnet and an iron case) is disposed on an inner side of the fan impeller 112. The stator 118 (including an insulation support assembly, a silicon steel sheet assembly disposed between the insulation support assembly and a winding set wound on the silicon steel sheet assembly and the insulation support assembly) is positioned above the fan circuit board 113 and correspondingly spaced from the rotor 117. The stator 118 is electrically connected with the fan circuit board 113. When powered on, the stator 118 is magnetized to produce electromagnetic induction with the rotor 117 so as to drive the rotor 117 as well as the fan impeller 112 to rotate.

The connector connection section 114 outward protrudes from the sidewall 1113 or the base seat 1112 of the fan frame main body 111 and is integrally formed with the fan frame main body 111. That is, the connector connection section 114 is integrally formed on the sidewall 1113 or the base seat 1112. In this embodiment, the connector connection section 114 is integrally formed on the sidewall 1113. The connector connection section 114 has an upper force-bearing face 1141 for bearing an external pressure coining from upper side. The connector connection section 114 is such as, but not limited to, a slide channel, a socket, a buckle, a clip or an insertion connection structure. The upper force-bearing face 1141 is positioned on the same side as the upper cover 1111 or the base seat 1112 of the fan frame main body 111. In this embodiment, the upper force-bearing face 1141 is positioned on the same side as the base seat 1112 (as the upper side of the drawing).

The wire set 115 has an inner end 1151 connected with the fan circuit board 113 positioned in the fan frame main body 111 and an outer end 1152 exposed to outer side of the fan frame main body 111 and connected with the fan end connector 12. The fan end connector 12 has a mating section 121 correspondingly assembled with the connector connection section 114, whereby the fan end connector 12 is securely connected with the fan frame main body 111 as an integrated body. As shown in the drawings, the fan end connector 12 is, but not limited to, connected with the connector connection section 114 in a lateral direction. In practice, the fan end connector 12 can be connected with the connector connection section 114 in a direction according to the arrangement direction of the connector connection section 114. For example, the fan end connector 12 can be alternatively connected with the connector connection section 114 in a normal direction or an oblique direction.

In addition, the connector connection section 114 is selectively disposed on the sidewall 1113 or the base seat 1112 so that the fan end connector 12 is secured to the sidewall 1113 or the base seat 1112 with the connector connection section 114. As shown in the drawings, the fan end connector 12 is, but not limited to, protruded in a parallel direction Y1 of the sidewall 1113, (that is, protruded toward the lower side of the fan 11). In practice, the fan end connector 12 can be alternatively protruded in a normal direction X1 of the sidewall 1113 or protruded in a normal direction Y2 of the base seat 1112. Accordingly, the fan 11 can be assembled and connected with the system circuit board 22 in an axial (normal) direction or a radial (parallel) direction (as shown in FIG. 3).

Furthermore, a wire receiving channel 116 is selectively disposed on an outer surface of the fan frame main body 111 for receiving the wire set 115. Before or after the fan end connector 12 is securely connected with the fan frame main body 111, the wire set 115 is trimmed and received in the wire receiving channel 116.

In general, the fan 11 can be assembled with the system circuit board 22 by means of disposing fixing seats corresponding to the fan 11. Then the fan 11 is connected and assembled with the system circuit board 22 by means of screws, clips or buckles.

Figure 3:
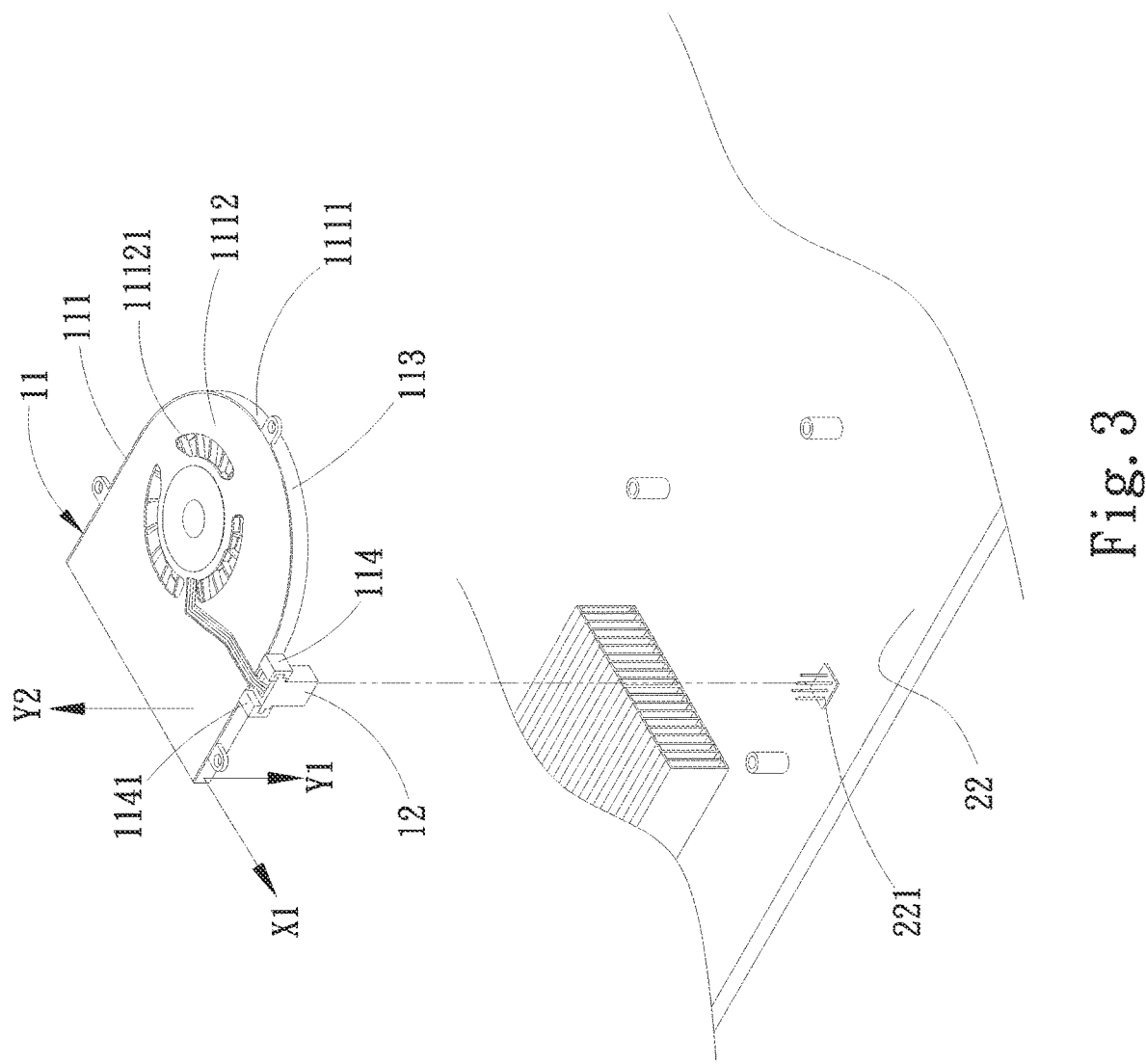
FIG. 3 is a perspective view showing that the fan end connector of the fan structure of the present invention is directly electrically connected to the circuit board end connector on the system circuit board.

Please now refer to FIG. 3, which is a perspective view showing that the fan of the present invention is mounted on the system circuit board. As shown in the drawing, when the fan 11 is mounted on the system circuit board (such as motherboard) 22 through an automatically manufacturing process, the fan end connector 12 is aligned with a circuit board end connector 221 on the system circuit board 22. The upper force-bearing face 1141 of the connector connection section 114 serves as a force application pressurized position for bearing an external pressure (such as a downward pressing force applied by an automated device such as a pressing tool, a sucker or a robotic arm). Accordingly, the fan end connector 12 is pressed downward to directly electrically connect with (such as plug into or contact) the circuit board end connector 221. Therefore, the fan 11 is automatically mounted on the system circuit board 22. Moreover, as shown in the drawing, the fan end connector 12 is, but not limited to, a connector plug, while the circuit board end connector 221 is, but not limited to, a connector socket or metal pins. In practice, the fan end connector 12 can be alternatively a connector socket, while the circuit board end connector 221 can be a connector plug.

By means of the fan fast connection structure 10 of the present invention, when the fan 11 is mounted on the system circuit board 22, the fan end connector 12 is also directly electrically connected with the circuit board end connector 221. Therefore, the production process can be automated and no residual fan wire is positioned between the fan 11 and the system circuit board 22.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A fan structure automatically mountable on a system circuit board, the system circuit board having a circuit board end connector, the fan structure comprising:

a fan having a fan frame main body and a wire set, the fan frame main body having an upper cover facing the system circuit board, a base seat mated with the upper cover, a sidewall positioned between and mating the upper cover and the base seat, and a connector connection section outward protruding from the sidewall of the fan frame main body and having an upper force-bearing face configured as a force application pressurized position to bear an external pressure, a fan impeller and a fan circuit board being received in the fan frame main body, the wire set having an end connected with the fan circuit board and another end exposed to outer side of the fan frame main body and connected with a fan end connector with a mating section configured to assemble with the connector connection section, the fan end connector connected with the connector connection section at the sidewall and secured to the fan frame main body, whereby the fan end connector can be directly electrically connected with the circuit board end connector through an automatically manufacturing process.

2. The fan structure automatically mountable on a system circuit board as claimed in claim 1, wherein the fan end connector protrudes in a parallel direction of the sidewall.

3. The fan structure automatically mountable on a system circuit board as claimed in claim 1, wherein one of the fan end connector and the circuit board end connector is a connector plug, while the other of the fan end connector and the circuit board end connector is a connector socket.

4. The fan structure automatically mountable on a system circuit board as claimed in claim 1, wherein the fan end connector can be directly pressed down to electrically connect with the circuit board end connector.

5. The fan structure automatically mountable on a system circuit board as claimed in claim 1, wherein a wire receiving channel is disposed on the fan frame main body for receiving the wire set.

6. The fan structure automatically mountable on a system circuit board as claimed in claim 1, wherein a rotor and a stator are further received in the fan frame main body, the rotor being disposed on an inner side of the fan impeller, the stator being spaced from the rotor and positioned corresponding to the rotor.

* * * * *